(12) United States Patent
Mathijssen

(10) Patent No.: US 9,733,572 B2
(45) Date of Patent: Aug. 15, 2017

(54) METHOD AND APPARATUS FOR MEASURING ASYMMETRY OF A MICROSTRUCTURE, POSITION MEASURING METHOD, POSITION MEASURING APPARATUS, LITHOGRAPHIC APPARATUS AND DEVICE MANUFACTURING METHOD

(71) Applicant: ASML Netherlands B.V., Veldhoven (NL)

(72) Inventor: Simon Gijsbert Josephus Mathijssen, Den Bosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 159 days.

(21) Appl. No.: 14/764,939

(22) PCT Filed: Mar. 6, 2014

(86) PCT No.: PCT/EP2014/054345
§ 371 (c)(1),
(2) Date: Jul. 30, 2015

(87) PCT Pub. No.: WO2014/146906
PCT Pub. Date: Sep. 25, 2014

(65) Prior Publication Data
US 2015/0355554 A1 Dec. 10, 2015

Related U.S. Application Data

(60) Provisional application No. 61/803,673, filed on Mar. 20, 2013.

(51) Int. Cl.
*G01B 11/00* (2006.01)
*G03F 7/20* (2006.01)
(Continued)

(52) U.S. Cl.
CPC .......... *G03F 7/70141* (2013.01); *G01B 11/14* (2013.01); *G03F 9/7046* (2013.01);
(Continued)

(58) Field of Classification Search
CPC .. G03F 7/70141; G03F 9/7046; G03F 9/7076; G03F 9/7088; G03F 9/7092
(Continued)

(56) References Cited

U.S. PATENT DOCUMENTS 6,538,740 B1  3/2003  Shiraishi et al.
6,961,116 B2  11/2005  Den Boef et al.
(Continued)

FOREIGN PATENT DOCUMENTS

EP  2 071 402    6/2009
JP  H09-504142   4/1997
(Continued)

OTHER PUBLICATIONS

Japanese Office Action mailed Nov. 8, 2016 in corresponding Japanese Patent Application No. 2016-504547.
(Continued)

*Primary Examiner* — Peter B Kim
(74) *Attorney, Agent, or Firm* — Pillsbury Winthrop Shaw Pittman LLP

(57) ABSTRACT

A lithographic apparatus includes an alignment sensor including a self-referencing interferometer for reading the position of a mark including a periodic structure. An illumination optical system focuses radiation of different colors and polarizations into a spot which scans said structure. Multiple position-dependent signals are detected in a detection optical system and processed to obtain multiple candidate position measurements. Each mark includes sub-structures of a size smaller than a resolution of the optical system. Each mark is formed with a positional offset between the (Continued)

sub-structures and larger structures that is a combination of both known and unknown components. A measured position of at least one mark is calculated using signals from a pair of marks, together with information on differences between the known offsets, in order to correct for said unknown component of said positional offset.

16 Claims, 9 Drawing Sheets

(51) Int. Cl.
*G01B 11/14* (2006.01)
*G03F 9/00* (2006.01)

(52) U.S. Cl.
CPC .......... *G03F 9/7076* (2013.01); *G03F 9/7088* (2013.01); *G03F 9/7092* (2013.01)

(58) Field of Classification Search
USPC ........................................................ 355/67
See application file for complete search history.

(56) References Cited

U.S. PATENT DOCUMENTS

| | | | |
|---|---|---|---|
| 6,982,793 | B1 | 1/2006 | Yang et al. |
| 7,466,413 | B2 | 12/2008 | Finders et al. |
| 8,072,615 | B2 | 12/2011 | Musa et al. |
| 8,208,121 | B2 | 6/2012 | Bijnen et al. |
| 8,593,646 | B2 | 11/2013 | Den Boef et al. |
| 2002/0021434 | A1 | 2/2002 | Nomura et al. |
| 2003/0199131 | A1 | 10/2003 | Fujimoto |
| 2004/0033426 | A1 | 2/2004 | Den Boef et al. |
| 2005/0031969 | A1 | 2/2005 | Finders et al. |
| 2009/0153861 | A1 | 6/2009 | Musa et al. |
| 2009/0195768 | A1 | 8/2009 | Bijnen et al. |
| 2012/0212749 | A1 | 8/2012 | Den Boef et al. |

FOREIGN PATENT DOCUMENTS

| | | |
|---|---|---|
| JP | 2005-031681 | 2/2005 |
| JP | 2009-188404 | 8/2009 |

OTHER PUBLICATIONS

Justin Lloyd Kreuzer et al., U.S. Appl. No. 61/623,391, filed Apr. 12, 2012.

Patricius Aloysius Jacobus Tinnemans et al., U.S. Appl. No. 61/722,671, filed Nov. 5, 2012.

International Search Report and Written Opinion mailed Oct. 9, 2014 in corresponding International Patent Application No. PCT/EP2014/054345.

Jeroen Huijbregtse et al., "Overlay Performance with Advanced ATHENA™ Alignment Strategies," Proc. of SPIE, vol. 5038, pp. 918-928 (2003).

Henry Megens et al., "Advances in Process Overlay—Alignment Solutions for Future Technology Nodes," Proc. of SPIE, vol. 6518, pp. 65181Z-1-65181Z-12 (2007).

Author Unknown, "Capturing Versatile Scribe-line Primary Marks (VSPM) or the like with a vision capture sensor," Research Disclosure, Mason Publications, Hampshire, Great Britain, vol. 505, No. 8, 2 pages (May 1, 2006).

Euclid E. Moon et al., "Interferometric-spatial-phase imaging for six-axis mask control," J. Vac. Sci. Technol, B, vol. 21, No. 6, pp. 3112-3115 (Nov./Dec. 2003).

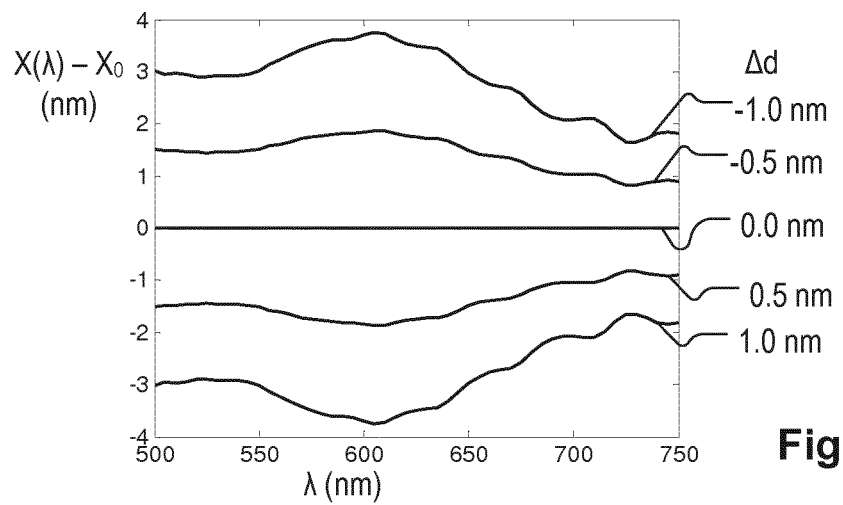
Fig. 7
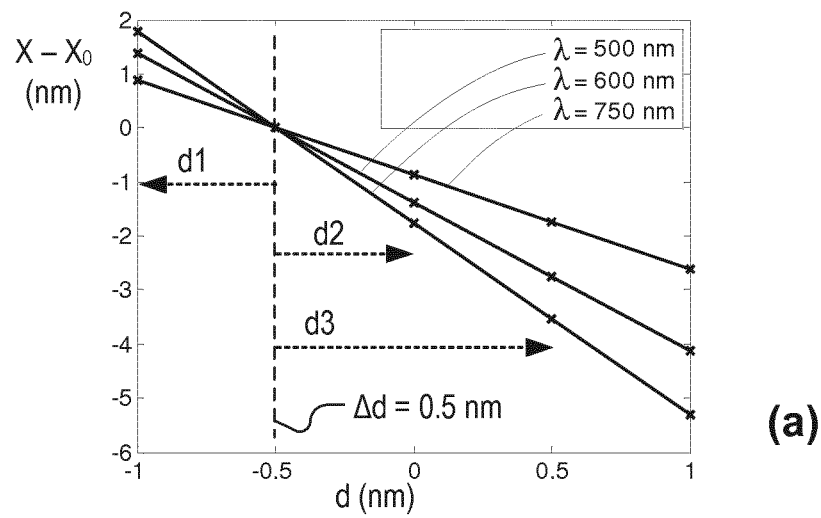
(a)
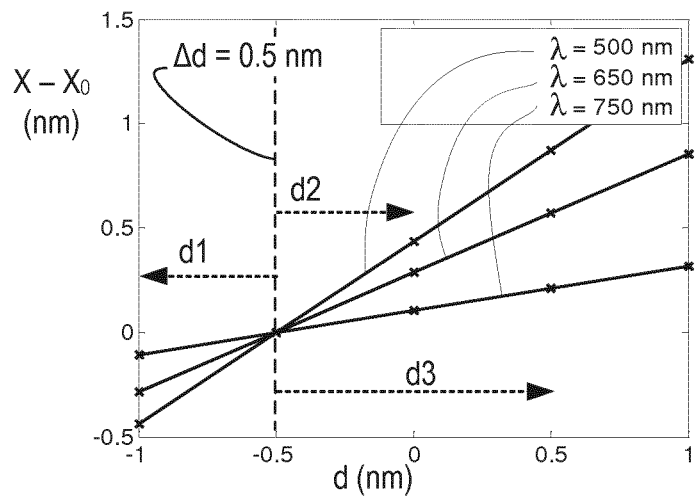
(b)
Fig. 8

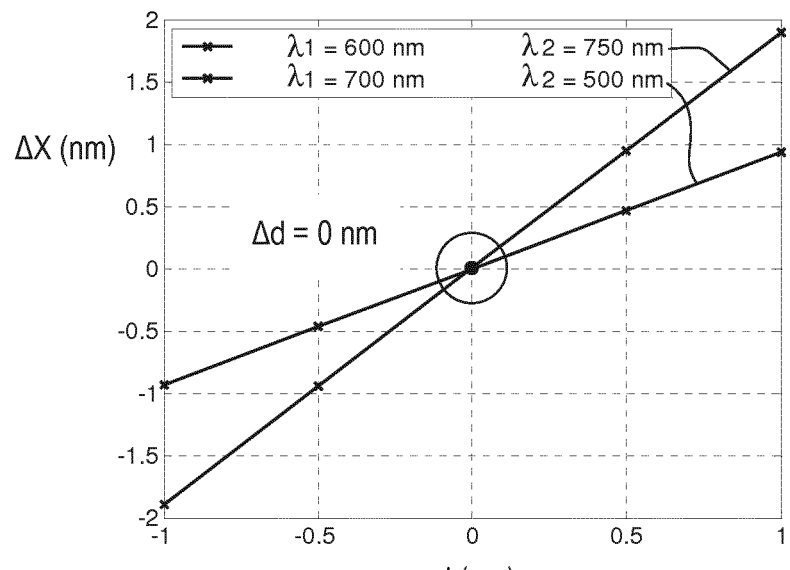
(a)
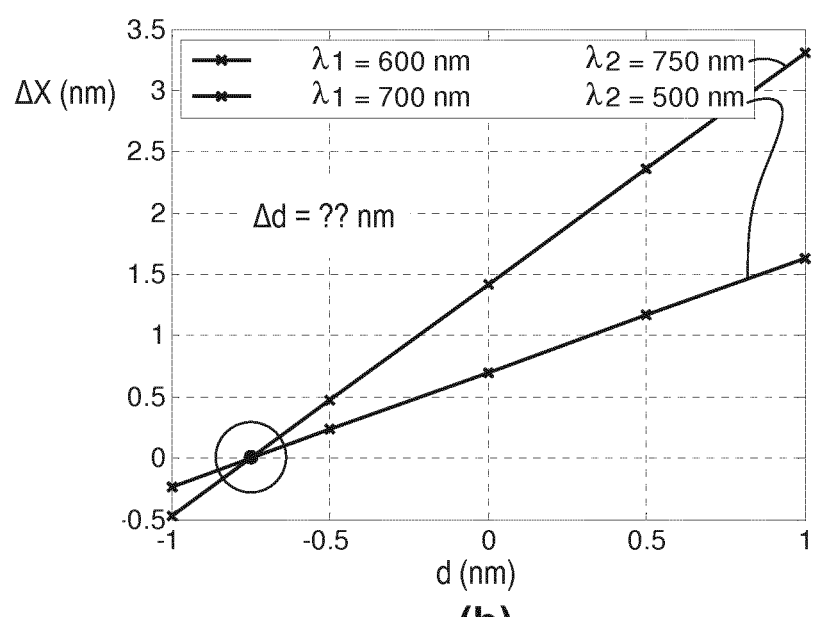
(b)
Fig. 9

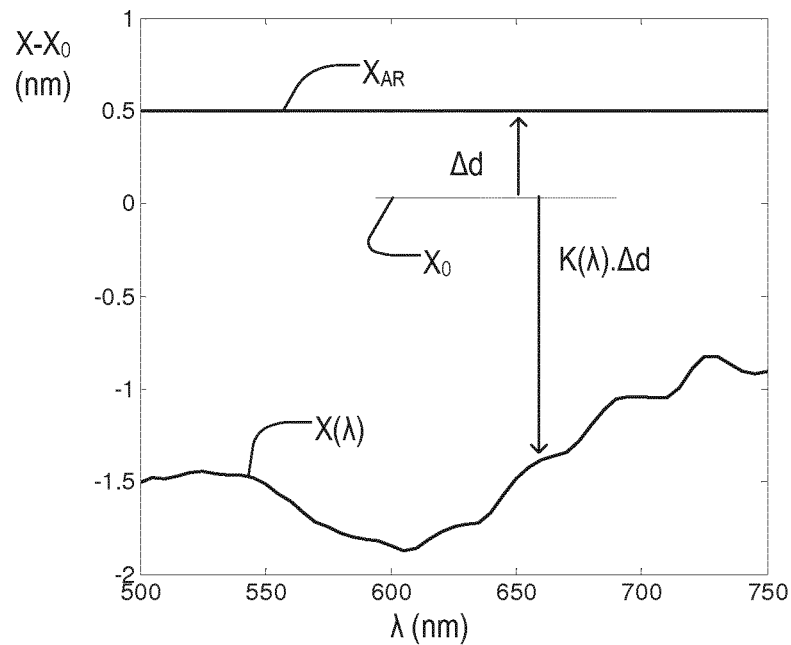
(a)
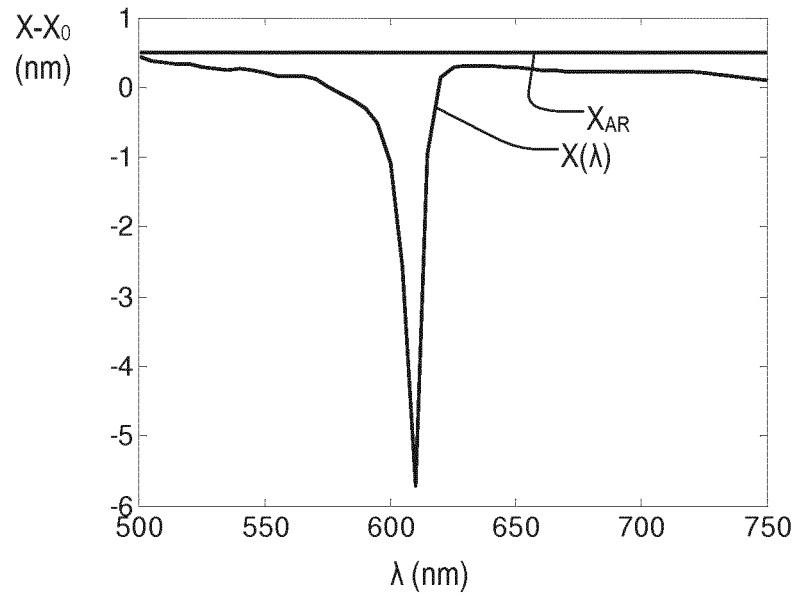
(b)
Fig. 12

METHOD AND APPARATUS FOR MEASURING ASYMMETRY OF A MICROSTRUCTURE, POSITION MEASURING METHOD, POSITION MEASURING APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2014/054345, which was filed on Mar. 6, 2014, which claims the benefit of priority of U.S. provisional application No. 61/803,673, which was filed on Mar. 20, 2013, and which is incorporated herein in its entirety by reference.

FIELD

The present invention relates to measurement of asymmetry in microstructures. The invention may be applied in an improved apparatus and method for measuring the positions of marks on a substrate. The invention in other aspects provides a lithographic apparatus and device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment sensors by which positions of marks on a substrate can be measured accurately. These alignment sensors are effectively position measuring apparatuses. Different types of marks and different types of alignment sensors are known from different times and different manufacturers. A type of sensor widely used in current lithographic apparatus is based on a self-referencing interferometer as described in U.S. Pat. No. 6,961,116 (den Boef et al). Generally marks are measured separately to obtain X- and Y-positions. However, combined X- and Y-measurement can be performed using the techniques described in published patent application US 2009/195768 A (Bijnen et al). The contents of both of these applications are incorporated herein by reference.

Advanced alignment techniques using a commercial alignment sensor are described by Jeroen Huijbregtse et al in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003). These strategies can be extended and applied commercially in sensors of the type described by US'116 and US'768, mentioned above. A feature of the commercial sensors is that they measure positions using several wavelengths (colors) and polarizations of radiation (light) on the same target grating or gratings. No single color is ideal for measuring in all situations, so the commercial system selects from a number of signals, which one provides the most reliable position information.

There is continually a need to provide more accurate position measurements, especially to control the overlay error as product features get smaller and smaller. One cause of error in alignment is sensitivity of the position sensor to sub-resolution features present in the mark. To explain, alignment marks are generally formed of gratings with features far larger than the features of the device pattern which is to be applied to the substrate in the lithographic apparatus. The required positioning accuracy is therefore obtained not by the fineness of the alignment grating, but rather by the fact that it provides a periodic signal that can be measured over many periods, to obtain overall a very accurate position measurement. On the other hand, a very coarse grating is not representative of the actual product features, and therefore its formation is subject to different processing effects than the real product features. Therefore it is customary for the coarse grating of the alignment mark to be made up of finer product-like features. These finer gratings are examples of the "sub-resolution" features referred to above, being too fine to be resolved by the alignment sensor. They may be referred to more commonly as "at-resolution" features, however, by reference to the resolving power of the patterning system in the lithographic apparatus. More discussion of these issues and different forms of sub-segmented marks are described in Megens et al, "Advances in Process Overlay—Alignment Solutions for Future Technology Nodes" in Metrology, Inspection, and Process Control for Microlithography XXI, Proc. of SPIE Vol. 6518, 65181Z, (2007), doi: 10.1117/12.712149.

The alignment marks are typically applied to the substrate at an early stage in a device manufacturing process, using a lithographic apparatus similar or even identical to the one which will apply the patterns for subsequent product layers. The at-resolution features become subject to slightly different errors in their positioning than the coarser alignment grating features, for example due to aberrations in an optical projection system used to apply the pattern. The effect of this in current alignment sensors is that the measured position contains unknown errors, being neither the position of the coarse grating nor that of the finer at-resolution grating. It has further been found that, depending on the color and polarization used in the position measurement, the error in the reported position caused by a mismatch in position between the coarse and fine gratings can be much greater than the mismatch itself.

SUMMARY

The invention in one aspect aims to provide an improved position measurement apparatus, for example an alignment sensor in a lithographic apparatus, that is able to correct errors caused by mismatch between at-resolution features and coarse grating features in position measurements. In that regard, the inventor has sought a method that can be applied to position measurement from alignment marks, without unduly reducing throughput of an alignment system. Further the inventor has sought a method that employs signals already captured as part of the position measuring task in known and proposed types of sensors.

The invention in a first aspect provides a method of measuring positions of marks on a substrate using an optical system, each mark comprising structures arranged periodically in at least a first direction, at least some of said structures comprising smaller sub-structures, each mark being formed with a positional offset between the structures and the sub-structures that is a combination of both known and unknown components, the method comprising:

(a) illuminating each mark with radiation and detecting radiation diffracted by said structure using one or more detectors to obtain signals containing information on the position of the mark;

(b) processing said signals to calculate a measured position of at least one mark, the calculation using signals from a plurality of marks, together with information on differences between the known offsets of said marks, in order to correct for said unknown component of said positional offset.

The sub-structures may be of a size smaller than a resolution of said optical system. The method in some embodiments uses a plurality of signals containing position information for each mark, each signal having the same form but being obtained for example using radiation having different characteristics, or using different spectral components of a position-dependent signal obtained by a single detector.

The invention can be implemented using the known types of sensors mentioned above, but also using optical position sensors of different design, provided that they can measure the position of a mark using different wavelengths and/or different diffraction orders and/or different polarizations of radiation and illumination profiles.

The invention in a further aspect provides a method of manufacturing devices wherein a device pattern is applied to a substrate using a lithographic process, the method including positioning the applied pattern by reference to measured positions of one or more marks formed on the substrate, the measured positions being obtained by a method according to the first aspect of the invention, as set forth above.

The invention yet further provides a substrate provided with a plurality of marks, each mark comprising structures arranged to repeat with a spatial period in at least a first direction, at least some of said structures comprising sub-structures of a size several times smaller than said spatial period, wherein each mark is formed with a positional offset between the sub-structures and structures that is a combination of both known and unknown components, the known components being different for different marks.

The period of the structure may be for example greater than 1 μm while the sub-structures have a feature size smaller than 0.5 μm. The sub-structures within each structure may have a feature size more than 5, 8 or 10 times smaller than said spatial period.

The invention yet further provides a lithographic apparatus comprising:
  a patterning subsystem for transferring a pattern to a substrate;
  a measuring subsystem for measuring positions of said substrate in relation to the patterning subsystem,
wherein the patterning subsystem is arranged to use the positions measured by the measuring subsystem to apply said pattern at a desired position on the substrate and wherein the measuring subsystem is arranged to measure the positions of said substrate using periodic structures provided on the substrate and measuring the positions of said structures using a method according to the second aspect of the invention, as set forth above.

The invention yet further provides an apparatus for measuring positions of marks on a substrate, the apparatus comprising:
  an optical system adapted for illuminating each mark with radiation and detecting radiation diffracted by said structure using one or more detectors to obtain signals containing information on the position of the mark;
  a processing arrangement for processing signals representing the diffracted radiation to obtain a plurality of results related to a position of the structure, each result being influenced in a different way by variations in a property of the structure; and
  a calculating arrangement for calculating a position of said structure using one or more of the results obtained by said processing arrangement,
    wherein said calculating arrangement is arranged to calculate a measured position of at least one mark using signals from a plurality of marks, each mark comprising structures arranged periodically in at least a first direction, at least some of said structures comprising sub-structures of a size smaller than a resolution of said optical system, each mark being formed with a positional offset between the structures and the sub-structures that is a combination of both known and unknown components, the calculating arrangement using said signals together with information on differences between known offsets of said marks in order to correct for said unknown component of said positional offset. The invention yet further provides a computer program product comprising machine-readable instructions for causing a processing device to perform the calculation of step (b) of the method set forth above.

Embodiments of the invention enable measurements of coarse and at-resolution features to be obtained separately using information that is ordinarily captured by an alignment sensor, but not ordinarily exploited. Said plurality of results may for example include results based on different wavelengths, different polarizations, different spatial frequencies (diffraction orders), or all of these. The method can be used in combination with more measurements of the same properties of the mark, property made by other means, and measurements of other properties made using the same instrument.

BRIEF DESCRIPTION OF THE DRAWINGS

Embodiments of the invention will now be described, by way of example only, with reference to the accompanying schematic drawings in which:

FIG. 2(a) and FIG. 2(b), illustrates various forms of an alignment mark that may be provided on a substrate in the apparatus of FIG. 1;

FIG. 7 shows response curves calculated for a range of mismatch values;

FIG. 8 illustrates the influence of different mismatch values on a position error measured at different wavelengths;

FIG. 9 illustrates the influence of different offset values (deliberate mismatch) on differential position measurements made between different pairs of wavelengths in a mark having (a) zero mismatch and (b) non-zero mismatch;

FIG. 12 shows response curves illustrating the successful correction of errors caused by mismatch between coarse and at-resolution features.

DETAILED DESCRIPTION OF EXEMPLARY EMBODIMENTS

Figure 1:
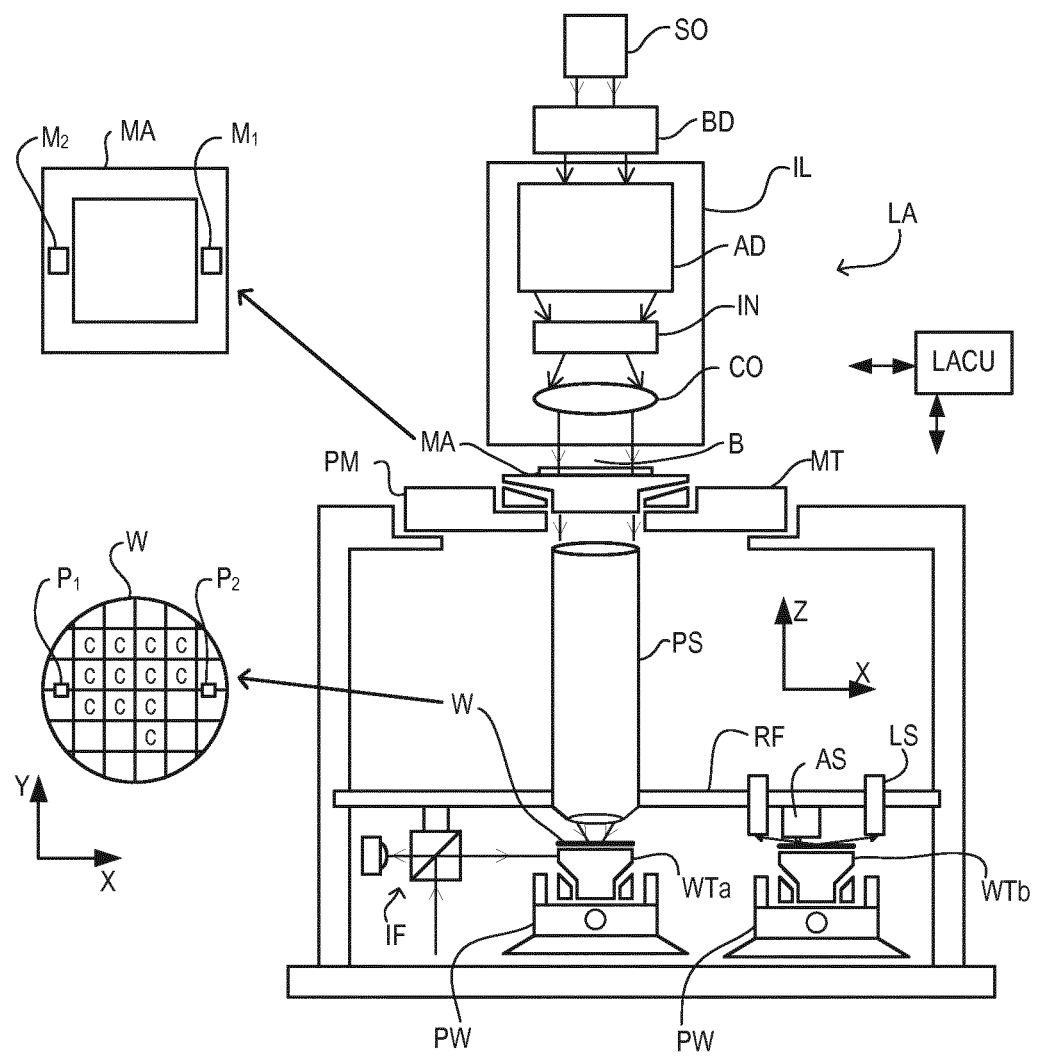
FIG. 1 depicts an exemplary lithographic apparatus including an alignment sensor forming measuring apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of to apparatus may be controlled by a central processing unit, communicating with these sub-systems processing units, with operators and with other apparatuses involved in the lithographic manufacturing process.

Figure 2:
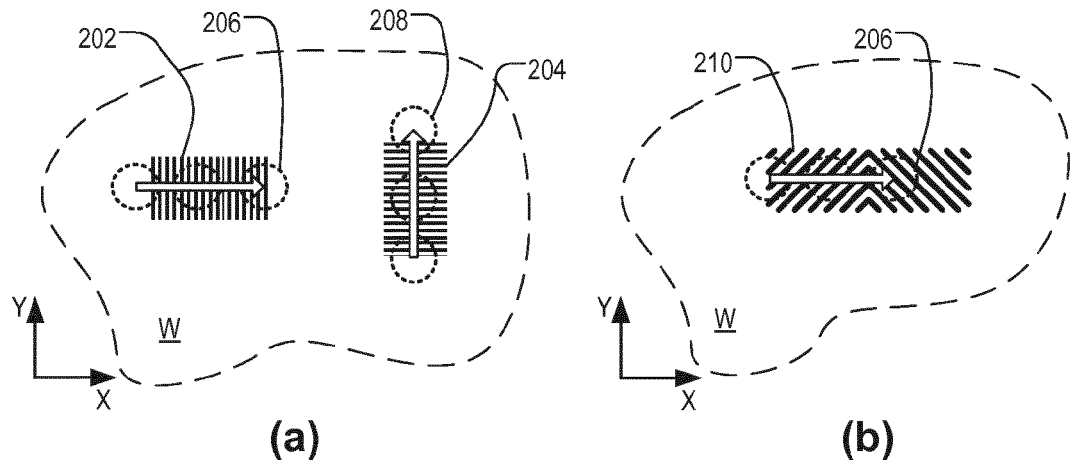
FIG. 2, comprising

FIG. 2(a) shows examples of alignment marks 202, 204, provided on substrate W for the measurement of X-position and Y-position, respectively. Each mark in this example comprises a series of bars formed in a product layer or other layer applied to or etched into the substrate. The bars are regularly spaced and act as grating lines so that the mark can be regarded as a diffraction grating with a sufficiently well-known spatial period (pitch). The bars on the X-direction mark 202 are parallel to the Y-axis to provide periodicity in the X direction, while the bars of the Y-direction mark 204 are parallel to the X-axis to provide periodicity in the Y direction. The alignment sensor AS (shown in FIG. 1) scans each mark optically with a spot 206 (X direction), 208 (Y direction) of radiation, to obtain a periodically-varying signal, such as a sine wave. The phase of this signal is analyzed, to measure the position of the mark, and hence of substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are again well known to the person skilled in the art, and will not be detailed herein. The design and operation of such sensors is well known in the art, and each lithographic apparatus may have its own design of sensor. For the purpose of the present description, it will be assumed that the alignment sensor AS is generally of the form described in U.S. Pat. No. 6,961,116 (den Boef et al). FIG. 2(b) shows a modified mark for use with a similar alignment system, which X- and Y-positions can be obtained through a single optical scan with the illumination spot 206 or 208. The mark 210 has bars arranged at 45 degrees to both the X- and Y-axes. This combined X- and Y-measurement can be performed using the techniques described in published patent application US 2009/195768 A (Bijnen et al), the contents of which are incorporated herein by reference.

Figure 3:
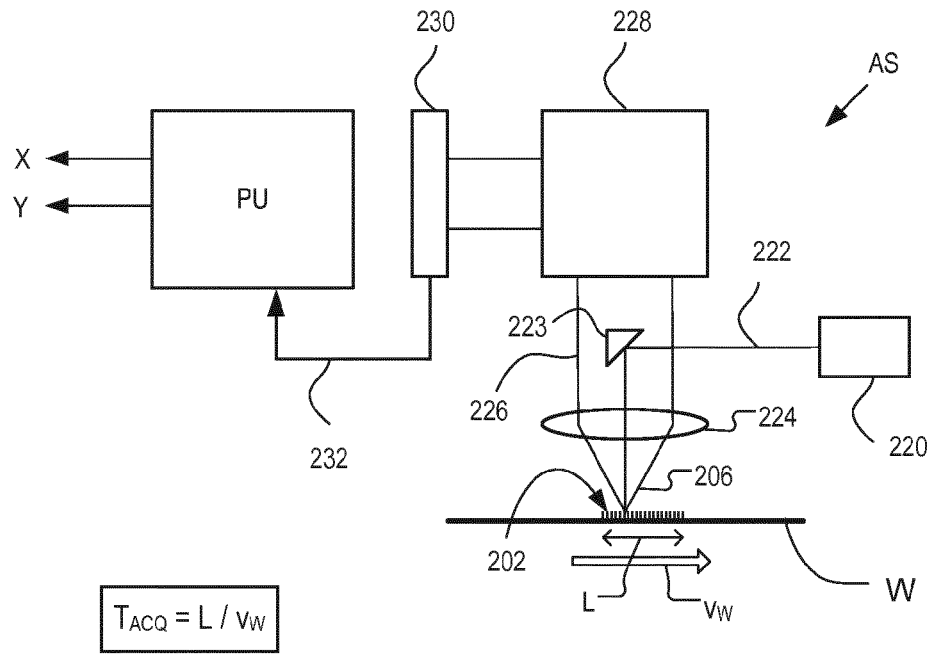
FIG. 3 is a schematic block diagram of a known alignment sensor scanning an alignment mark in the apparatus of FIG. 1.

FIG. 3 is a schematic block diagram of a known alignment sensor AS. Illumination source 220 provides a beam 222 of radiation of one or more wavelengths, which is diverted by a spot minor 223 through an objective lens 224 onto a mark, such as mark 202, located on substrate W. As indicated schematically in FIG. 2, in the example of the present alignment sensor based on U.S. Pat. No. 6,961,116, mentioned above, the illumination spot 206 by which the mark 202 is illuminated may be slightly smaller in diameter then the width of the mark itself.

Radiation scattered by mark 202 is picked up by objective lens 224 and collimated into an information-carrying beam 226. A self-referencing interferometer 228 is of the type disclosed in US'116, mentioned above and processes beam 226 and outputs separate beams (for each wavelength) onto a sensor array 230. Spot mirror 223 serves conveniently as a zero order stop at this point, so that the information carrying beam 226 comprises only higher order diffracted radiation from the mark 202 (this is not essential to the measurement, but improves signal to noise ratios). Intensity signals 232 from individual sensors in sensor grid 230 are provided to a processing unit PU. By a combination of the optical processing in the block 228 and the computational processing in the unit PU, values for X- and Y-position on the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the mark within a certain range corresponding to one pitch of the mark. Coarser measurement techniques are used in conjunction with this to identify which period of the sine wave is the one containing the marked position. The same process at coarser and/or finer levels can be repeated at different wavelengths for increased accuracy, and for robust detection of the mark irrespective of the materials from which the mark is made, and on and/or below which it sits. The wavelengths can be multiplexed and demultiplexed optically so as to be processed simultaneously, and/or they may be multiplexed by time division or frequency division. Examples in the present disclosure will exploit measurement at several wavelengths to provide a practical and robust measurement apparatus (alignment sensor) with reduced sensitivity to mark asymmetry.

Referring to the measurement process in more detail, an arrow labeled $v_W$ in FIG. 3 illustrates a scanning velocity with which spot 206 traverses the length L of mark 202. In this example, the alignment sensor AS and spot 206 in reality remain stationary, while it is the substrate W that moves with velocity $v_W$. The alignment sensor can thus be mounted rigidly and accurately to the reference frame RF (FIG. 1), while effectively scanning the mark 202 in a direction opposite to the direction of movement of substrate W. The substrate is controlled in this movement by its mounting on the substrate table WT and the substrate positioning system PW. All movements shown are parallel to the X axis. Similar actions apply for scanning the mark 204 with spot 208 in the Y direction. This will not be described further.

As discussed in the published patent application US 2012-0212749 A1, the high productivity requirements required of the lithographic apparatus require the measurement of the alignment marks at numerous positions on the substrate to be performed as quickly as possible, which implies that the scanning velocity $v_W$ is fast, and the time $T_{ACQ}$ available for acquisition of each mark position is correspondingly short. In simplistic terms, the formula $T_{ACQ}=L/v_W$ applies. The prior application US 2012-0212749 A1 describes a technique to impart an opposite scanning motion of the spot, so as to lengthen the acquisition time. The same scanning spot techniques can be applied in sensors and methods of the type newly disclosed herein, if desired.

There is interest in aligning on marks with smaller grating pitches. The measured overlay in real production is generally significantly larger than under controlled test conditions. Investigations suggest that this is due to the alignment marks on product wafers becoming asymmetric to varying degrees during processing. Reducing the pitch of the alignment marks decreases the effect of some types of asymmetry on the measured alignment position.

The skilled person knows that some options to allow reduction of the pitch of an alignment grating are (i) shortening the wavelength of radiation used, (ii) increasing the NA of the alignment sensor optics and (iii) using off-axis illumination. A shorter wavelength is not always possible since alignment gratings are often located underneath an absorbing film (for example an amorphous carbon hard mask). Increasing the NA is in general possible but is not preferred since there is a need for a compact objective with a safe distance from the wafer. Therefore using off-axis illumination is attractive.

Position Measurement with Multiple Wavelengths and Polarizations

Figure 4:
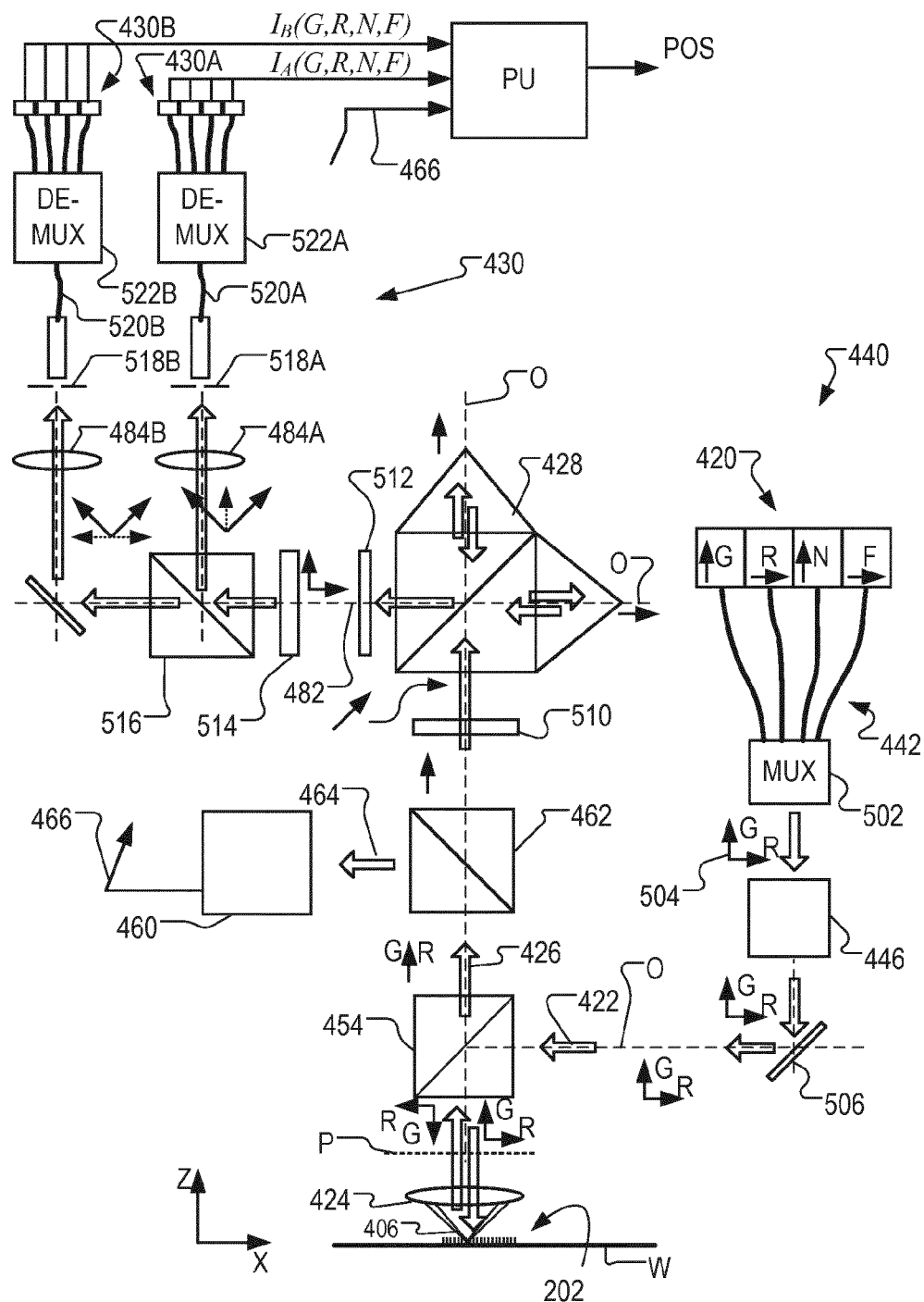
FIG. 4 is a more detailed schematic diagram of a modified alignment sensor suitable for use in an embodiment of the present invention and useable as the alignment sensor in the apparatus of FIG. 1, including off-axis illumination and an optional asymmetry measuring arrangement (not shown in detail) and further showing features of multiple wavelengths and polarization.

FIG. 4 illustrates an optical system of a novel alignment sensor that is a modified version of one described in the prior publications U.S. Pat. No. 6,961,116 and US 2009/195768 mentioned above. This introduces the option of off-axis illumination modes which, among other things, allow a reduced pitch of alignment mark for greater accuracy. The optical system may also allow scatterometry type measurements to be performed with the alignment sensor, rather than with a separate scatterometer instrument. In FIG. 4, for simplicity the details of providing off-axis and on-axis modes of illumination are omitted. For present disclosure it is more interesting to show details of the multiple wavelengths and polarizations.

An optical axis O which has several branches is indicated by a broken line running throughout the optical system 400. For ease of comparison with the schematic diagram of FIG. 3, some parts of the optical system 400 are labeled with reference signs similar to those used in FIG. 3, but with prefix "4" instead of "2". Thus, we see a light source 420, an illumination beam 422, an objective lens 424, an information carrying beam 426, a self-referencing interferometer 428 and a detector arrangement 430. Signals from the detector arrangement are processed by processing unit PU, which is modified so as to implement the novel features described below and to output an (improved) position measurement POS for each mark.

Additional components illustrated in this more detailed schematic diagram are as follows. In an illumination subsystem 440, radiation from source 420 is delivered via optical fibers 442 to an illumination profiling optics 446. This delivers input beam 422 via beam splitter 454 to objective lens 424 having a pupil plane P. Objective lens 424 forms a spot 406 on alignment mark 202/204/210 on the wafer W. Information-carrying beam 426, diffracted by the mark, passes through beam splitter 454 to interferometer 428. Interferometer 428 splits the radiation field into two parts with orthogonal polarization, rotates these parts about the optical axis by 180° relative to one another, and combines them into an outgoing beam 482. This beam enters the detector arrangement 430 as will be described in more detail below.

Included in the present example is an asymmetry measuring arrangement 460. Arrangement 460 receives a part 464 of the information carrying beam 426 through a second beam splitter 462 positioned in advance of the interferometer. Another patent application, U.S. 61/722,671 not published at the present priority date, describes novel techniques for the measurement of asymmetry using position information obtained through the detector 430. In principle, a dedicated asymmetry measuring arrangement 460 could be eliminated.

Illumination profiling optics 446 can take various forms, some of which are disclosed in more detail in our prior U.S. patent application Ser. 61/623,391, not published at the present priority date [Applicant ref P-3996]. In the examples disclosed therein, alignment sensors (more generally, position measuring apparatuses) are shown which allow the use of reduced grating pitches without the need for spatial resolution on the detector side. By use of novel illumination modes, these apparatuses are able to measure the positions of marks with a wide range of different pitches, for example from less than 1 μm to pitches of 20 micron, without changing the current detector design. A particular feature common to the examples described in the prior application 61/623,391, is the option to use off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the alignment mark from substantially $\lambda/NA$ to substantially $\lambda/2NA$, where $\lambda$ is the wavelength of radiation used, and NA is the numerical aperture of an objective lens of the instrument (e.g. the alignment sensor or more generally the position measuring apparatus). The examples described in the prior application 61/623,391, also use a particular distribution of spot mirrors in a beam splitter of the apparatus, which can both provide the desired illumination and act as a field stop for zero order diffracted radiation. A 'universal' illumination profile can be designed that allows for aligning on any of the X, Y and XY marks without changing the illumination mode, although this inevitably brings some compromise in performance and/or some complication in the apparatus. Alternatively, dedicated modes can be designed and made to be selectable for use with the different mark types. Different polarizations of illumination can be selected also.

The apparatus as a whole need not be limited to providing these particular off-axis illumination profiles. It may have other modes of use, both known or yet to be developed, which favor the use of different profiles. For example the apparatus may provide for selection of on- and off-axis illumination modes for the different mark types shown in FIG. 2(a) and (b). While off-axis illumination is of interest for use with finer gratings, an on-axis illumination profile may be useful for compatibility with existing marks and measurement methods. Referring firstly to the example of an on-axis mode, as used in the known sensor of FIG. 3, illumination normal to the substrate is provided by an on-axis illumination profile having a central bright spot within an otherwise dark pupil. This profile is an optional setting in the illumination beam 422 of the novel apparatus. In this example, it is desired for the zero order beam which returns along the optical axis to blocked before entry to interferometer 428, but also for it to be transferred to the asymmetry measuring arrangement 460 (when provided). To block the zero order before the interferometer 428 is not essential, but improves the signal to noise ratio of the position signal. Accordingly, in this embodiment, a spot mirror may be included in the second beam splitter 462. The first splitter 454 is not silvered, and one accepts that only 50% or so of the intensity of the central spot may is transferred to the mark. In an alternative embodiment, where the arrangement 460 is omitted, this profile may be produced directly by illumination profiler 446 and transmitted at full intensity to objective 424 by a spot mirror within the first beam splitter 454. A variety of alternatives can be envisaged to obtain a desired profile.

Off-axis illumination profiles can be produced in a number of ways to form a practical instrument, bearing in mind that the opposed segments should be coherent for the interferometer 428 to produce the desired signal. Particularly when a broadband source is involved, the coherence length/time of the source radiation will be very short. Even with a monochromatic laser source, US'116 teaches that a short coherence time is preferred, for example to eliminate interference from undesired multiple reflections. Consequently, optical path lengths from the source to each segment should be very closely matched. An aperture corresponding directly to the desired profile could be placed in a widened parallel beam, but that would result in a relatively large light loss. To circumvent the loss of light, we propose various alternative solutions in the prior application 61/623, 391, mentioned above.

The illumination emerging from the illumination source 442 may be monochromatic but is typically broadband in nature, for example white light, or polychromatic. A diversity of wavelengths in the beam increases the robustness of the measurement, as is known. The known sensor uses for example a set of four wavelengths named green, red, near infrared and far infrared. In a new sensor implementing the present invention, the same four wavelengths could be used, or a different four, or more or fewer than four wavelengths might be used.

Referring to FIG. 4 again, aspects of the apparatus concerned with measurement using multiple wavelengths of radiation, and concerned with the management of polarization effects, will now be explained. In illumination subsystem 440, source 420 comprises four individual sources are provided to produce radiation with of four wavelengths named green (labeled G), red (R), near infrared (N) and far infrared (F). For convenience in the following discussion, the radiation at these four different wavelengths will be called four colors of light, it being immaterial for present purposes whether they are in the visible or non-visible parts of the electromagnetic spectrum. All light sources are linearly polarized, with the G and N radiation being oriented the same as one another, and the R and F radiation being polarized orthogonally to the G and N polarization.

The four colors are transported by polarization maintaining fibers to a multiplexer 502 MUX, where they are combined into a single four-color beam. The multiplexer maintains linear polarization, as indicated by arrows 504. The arrows 504 and similar arrows throughout the diagram are labeled G and R to indicate polarization of the green and red components. The N and F components are oriented the same as the G and R components, respectively.

This combined beam goes via suitable delivery optics 506 into beam splitter 454. As already described, it then reflects from a partially- or fully reflecting surface (e.g. a 0.5 mm diameter spot mirror), which is inside the beam splitter. The objective lens 424 focuses the beam to a narrow beam which is reflected and diffracted by the grating formed by alignment mark 202 on the wafer. Light is collected by the objective, with for example numerical aperture NA=0.6. This NA value allows at least ten orders of diffraction to be collected from a grating with 16 μm pitch, for each of the colors.

The reflected and diffracted light forming information carrying beam 426 is then transported to the self-referencing interferometer 428. In this example, as already described, the beam is split 462 to supply a portion 464 of the information carrying beam to the asymmetry measuring arrangement 460, when provided. Signals 466 conveying asymmetry measurement information are passed from arrangement 460 to the processing unit PU. Just before the interferometer, polarization is rotated by 45° by a half wave plate 510. From this point on, polarization arrows are shown for only one color, for clarity. The interferometer, as already described above and in the patent US'116, consists of a polarizing beam splitter, where half of each color is transmitted, and half of each color reflected. Each half then is reflected three times inside the interferometer, rotating the radiation field by +90° and −90°, giving a relative rotation of 180°. The two fields are then superimposed on top of each other and allowed to interfere. A phase compensator 512 is present to compensate for path differences of the −90° and 90° image. The polarization is then rotated 45° by another half wave plate 514 (having its major axis set at 22.5° to the X or Y axis). The half wave plates 510, 514 are wavelength insensitive, so that polarizations of all four wavelengths are rotated by 45°.

A further beam splitter 516 splits the optical signal into two paths designated A and B. One path contains the sum of the two rotated fields, and the other contains the difference. Depending on the initial polarization direction, the sum ends up in Path A or Path B. So in this example the sum signals for Green and NIR signals end up in one path, Red and FIR in the other. For each color, the corresponding difference signal ends up in the other path.

Note that this arrangement chooses to use one polarization for illumination in each color. Measurements with two polarizations per color could be made, by changing the polarization between readings (or by time division multiplexing within a reading). However, to maintain high throughput while benefiting from some diversity in color and polarization, a set of different colors with single, but different, polarizations represents a good compromise between diversity and measurement throughput. To increase diversity without impacting throughput, one can envisage an implementation similar to the four-color scheme presented here, but using more colors, for example eight or sixteen, with mixed polarizations.

The light for each path A and B is collected by a respective collector lens assembly 484A and 484B. It then goes through an aperture 518A or 518B that eliminates most of the light from outside the spot on the substrate. Two multimode fibers 520A and 520B transport the collected light of each path to a respective demultiplexer 522A and 522B. The demultiplexer splits each path in the original four colors, so that a total of eight optical signals are delivered to detectors 430A and 430B within detector arrangement 430. In one practical embodiment, fibers go from the demultiplexer to eight detector elements on a detector circuit board. The detectors in this example provide no spatial resolution, but deliver time-varying intensity signals $I_A$ and $I_B$ for each color, as the apparatus scans the mark 202 etc. on substrate W. The signals are actually position-dependent signals, but received as time-varying signals (waveforms) synchronized with the physical scanning movement between the apparatus and the mark (recall FIG. 3).

Processing unit PU receives the intensity waveforms from the eight detectors and processes them as in the known apparatus to provide a position measurement POS. Because there are eight signals to choose from, based on different wavelengths and incident polarizations, the apparatus can obtain useable measurements in a wide variety of situations. In this regard it should be remembered that the mark 202 may be buried under a number of layers of different materials and structures. Some wavelengths will penetrate different materials and structures better than others. PU conventionally processes the waveforms and provides a position measurement based on the one which is providing the strongest position signal. The remaining waveforms may be disregarded. In a simple implementation, the 'recipe' for each measurement task may specify which signal to use, based on advance knowledge of the target structure, and experimental investigations. In more advanced systems, for example as described in the paper by Huijbregtse et al, mentioned in the introduction, an automatic selection can be made, using "Color Dynamic" or "Smooth Color Dynamic" algorithms to identify the best signals without prior knowledge.

Each lens 484A, 484B focuses the entire field onto each element of each detector 430A, 430B, which is an arrangement similar to the known alignment sensor of FIG. 3. The detectors in this example and in the known alignment sensor are effectively single photodiodes and do not provide any spatial information except by the scanning motion described already. A detector having spatial resolution in a conjugate pupil plane can be added, if desired. This may for example allow angle-resolved scatterometry methods to be performed using the alignment sensor hardware.

The mark may need to be scanned more than once if it is desired for example to measure position using two different polarizations. Also it may be required to switch the illumination mode midway through scanning the XY mark. In other embodiments, however, we use multiplexing of optical signals so that two measurements can be made simultaneously. Similarly, multiplexing can be applied so that different portions of the XY mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at each detector 430A, 430B will be a mixture of two signals, but they can be separated electronically using filters tuned to the respective frequencies of the source radiation. Time division multiplexing could also be used, but this would require accurate synchronization between source and detector. The modulation at each frequency can be a simple sine or square wave, for example.

If it is desired to illuminate a mark with circular polarization, whether for position sensing or some other form of metrology, a quarter wave plate (not shown) can be inserted between beam splitter 454 and objective 424. This has the effect of turning a linear polarization into a circular one (and changing it back again after diffraction by the mark). The spot positions are chosen as before according to the mark direction. The direction of circular polarization (clockwise/counterclockwise) can be changed by selecting a different linear polarization in the illumination source 420, fiber 422 or illumination profiling optics 446.

Also described in the paper by Huijbregtse et al is the use of multiple gratings in a composite target. Each grating has a different profile, enhancing for example higher diffraction orders ($3^{rd}$, $5^{th}$, $7^{th}$), Position measurements can be derived from different ones of these gratings, as well as from different color signals on an individual grating. In the present disclosure, it is assumed that there is a single grating with a simple bar pattern, but having segmented features. The skilled reader can readily expand the disclosure to envisage embodiments having multiple gratings with different patterns.

Position Measurement Corrected for At-Resolution Feature Mismatch

Figure 5:
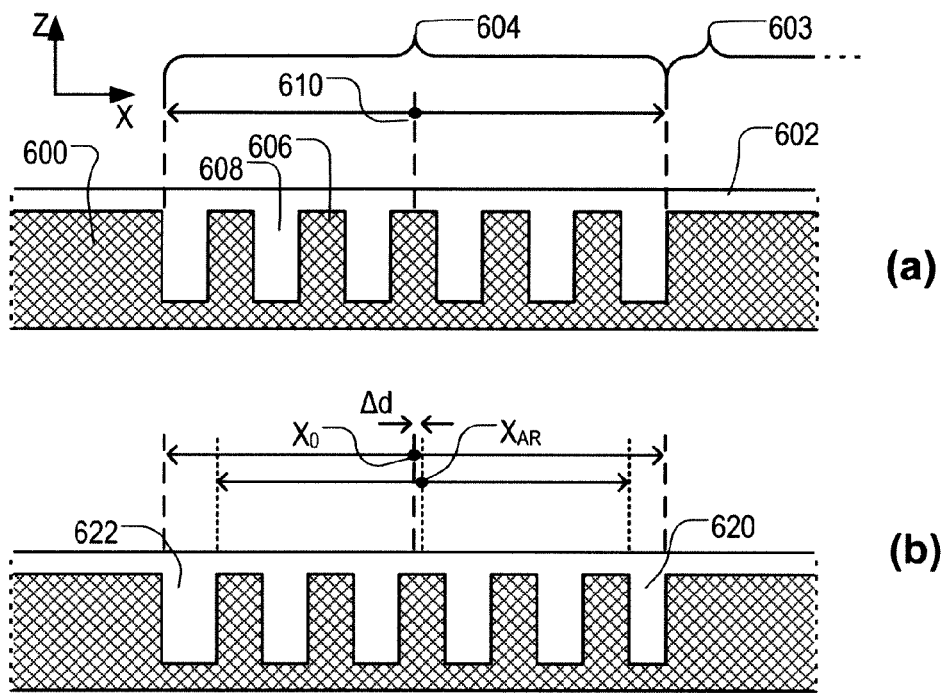
FIG. 5 is a detailed schematic cross-section of an alignment mark with at-resolution features (a) without and (b) with mismatch between coarse and at-resolution feature positions.

Referring now to FIG. 5 we introduce the phenomenon of mismatch between the position of a coarse alignment grating and fine "at-resolution" features, which together form a practical "sub-segmented" alignment mark. FIG. 5(*a*) shows in cross-section a small portion of an alignment mark such as the X-direction alignment mark 202 in FIG. 2(*a*). Specifically we see roughly one repeating unit comprising a mark-space pattern that is repeated with a known periodicity, to form the whole alignment mark. The mark is formed in materials 600, 602 having different refractive indices, arranged in a periodic pattern whose repeating unit comprises "mark" regions 603 and "space" regions 604. The mark-space pattern may in particular be formed by etching a pattern that is applied to a substrate using the lithographic apparatus of FIG. 1 or a similar apparatus. The designations "mark" and "space" in such a pattern are quite arbitrary. In fact, it will be noted that each "space" region 604 of the mark is formed such that the material 600 is not uniformly absent, but is rather present in a fine-pitch grating pattern comprising smaller marks 606 and spaces 608. Similarly, each "mark" region 603 is formed such that the material 600 is not uniformly present, but is present in a similar fine pitch grating pattern. This fine pitch pattern has a periodicity in the Y direction, that is into the page, and is therefore not visible in the cross-sections shown in FIG. 5. These finer marks and spaces are what is referred to herein as the "at-resolution" features, being at or close to the limit of resolution of the projection system in the lithographic apparatus that will use them. They may also be referred to as "sub-resolution" features as far as the alignment sensor AS shown in FIGS. 1 and 4 is concerned. Sub-segmented marks are currently used to minimize processing effects of the alignment marks and to obey pattern density requirements posed by end users. The form of mark illustrated in FIG. 5 having mark and space regions sub-segmented in orthogonal directions is an example similar to those discussed in the paper by Megens et al, mentioned in the introduction above.

Ideally, the fine grating formed by marks 606 will be centered on the same point 610 as the coarse grating. This point 610, averaged over all the marks in the grating, may define a central reference position of the whole mark. Sub-segmented marks are sensitive to lens aberrations, however, in the process by which the mark is formed. These aberrations cause a shift between the at-resolution features and the alignment grating pitch, which are usually orders of magnitude larger.

FIG. 5(*b*) shows the form of such a sub-segmented grating, similar to the ideal form (a) but exhibiting a shift or mismatch between the coarse alignment grating pitch and the at-resolution features. This grating has become asymmetric due to a shift between the larger alignment grating pitch and the at-resolution structures. A space 620 at one end of region 604 the sub-segmented space portion has become slightly narrower than space 622 at the other end. The at-resolution grating therefore has a central point at a position $X_{AR}$ which is not exactly coincident with the central point $X_0$ of the coarse alignment grating. A mismatch or shift $\Delta d$ represents the difference between $X_0$ and $X_{AR}$, and may be measured for example in nanometers Referring now to FIG. 6, the calculated graphs (a) and (b) illustrate that the asymmetric nature of the sub-segmented alignment grating causes an alignment sensor to measure a color dependent alignment signal. While the design of other types of alignment sensor may be different, in general the measured position of the mark will be different for different wavelengths and illumination conditions. These graphs show measured position from a simulated sensor, for a pattern with known mismatch $\Delta d = 0.5$ nm. The alignment position error X is defined on the vertical axis, relative to the center of the coarse grating at $X_0$. (This position is known because we are illustrating a simulation, not a real measurement of an unknown target.) For this example the simulation assumes a mark having coarse pitch=3 µm, at-resolution pitch=200 nm, depth=256 nm. The material 600 is silicon and material 602 is air. In graph (a) the illumination has Y-polarization (parallel to the grating lines for an X-direction mark), while graph (b) shows the result with X-polarization. Not evident from the graphs is that X-polarization has a higher diffraction efficiency than Y-polarization, for a mark 202 periodic in the X direction.

What can be seen in each graph is that the position reported by the simulated measurement varies quite widely in a manner strongly dependent on the wavelength and the polarization. The range of variation is moreover much greater that the magnitude of the mismatch $\Delta d$ that caused it. In the graph (b), a very strong resonance effect can be seen causing extreme measurement errors around 610 nm.

Figure 6:
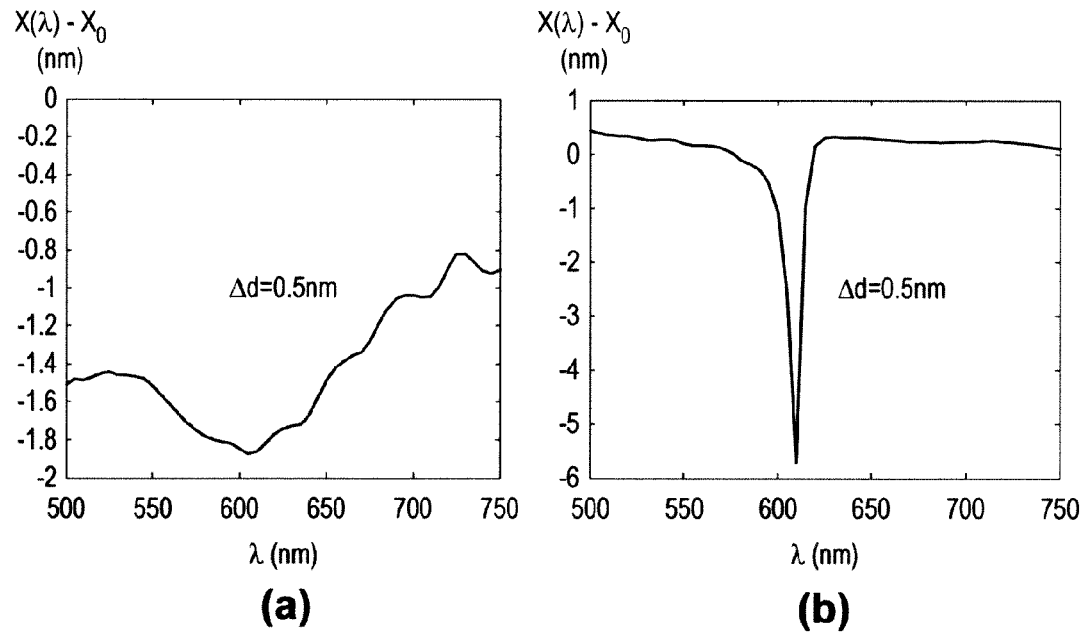
FIG. 6 shows response curves modeling the influence of a certain mismatch on measured position, for a range of radiation wavelengths and polarizations.

FIG. 7 is a graph corresponding to FIG. 6(*a*), but where the alignment position error $X-X_0$ is plotted as a function of wavelength for five different mismatch values $\Delta d$ ranging from −1 to +1 nm. The inventor has observed that the color dependent alignment position is to a good approximation a linear function of the in mismatch between the at-resolution features and the alignment grating pitch. The observation of linearity both in the alignment position offset as well as in the color to color is what we are going to exploit to obtain position measurements corrected for the (unknown) mismatch in the sub-segmented marks.

FIG. 8 further illustrates the linearity of the position error with different shifts, for measurements made using (a) Y polarization and (b) X polarization each at three different wavelengths $\lambda$. The horizontal axis in this case shows the value of a shift or offset d that has been deliberately introduced into a simulated mark structure. The offset d has been added to a simulated mismatch $\Delta d$ of 0.5 nm with different values indicated as d1, d2, d3 etc. Note that for each wavelength and polarization the measured position varies linearly with the offset d. Note moreover that the measured position matches exactly the coarse grating position $(X-X_0=0)$ when the added offset $d=-0.5$ nm is exactly enough to cancel the modeled unknown mismatch $\Delta d=0.5$ nm Under this condition, moreover, the measured position error is zero regardless of wavelength or polarization.

Now, in the simulated measurements represented in FIG. 8, the mismatch is known, but that is not the case in a real measurement situation. FIG. 9 illustrates how the known relationship (linearity) between mismatch and position error can be exploited to combine position measurements at different wavelengths and/or polarizations to determine all of $X_0$, $X_{AR}$ and $\Delta d$, if desired.

In FIG. 9 (*a*), there is plotted the difference $\Delta X$ between a position $X_1$ measured using wavelength $\lambda_1$ and a position $X_2$ measured using a wavelength $\lambda_2$ for different values of $\lambda_1$ and $\lambda_2$, In FIG. 9 (*a*) the measurements are simulated with a mismatch $\Delta d=0$ nm and different offsets d. Whatever wavelengths are selected, because of their linear relationship as illustrated in FIG. 8, the difference value $\Delta X$ will be zero when the offset d is zero. Suppose, as seen in FIG. 8 (*b*), the mismatch is supposedly unknown. Here a mismatch of 0.75 nm has been used in the simulation, but is effectively unknown. Observing that the difference between reported positions is zero when the offset d is −0.75 nm, that is exactly enough to cancel the unknown mismatch is $\Delta d$. Of course, in the problem addressed, one does not know the mismatch, and one does not know the dependency of the position measurements on the mismatch. However, if one can produce a mark that is designed to have portions with known, different offsets between them, one can obtain two points on a linear graph and one can calculate the position of the zero to find mismatch $\Delta d$ by interpolation or extrapolation.

Figure 10:
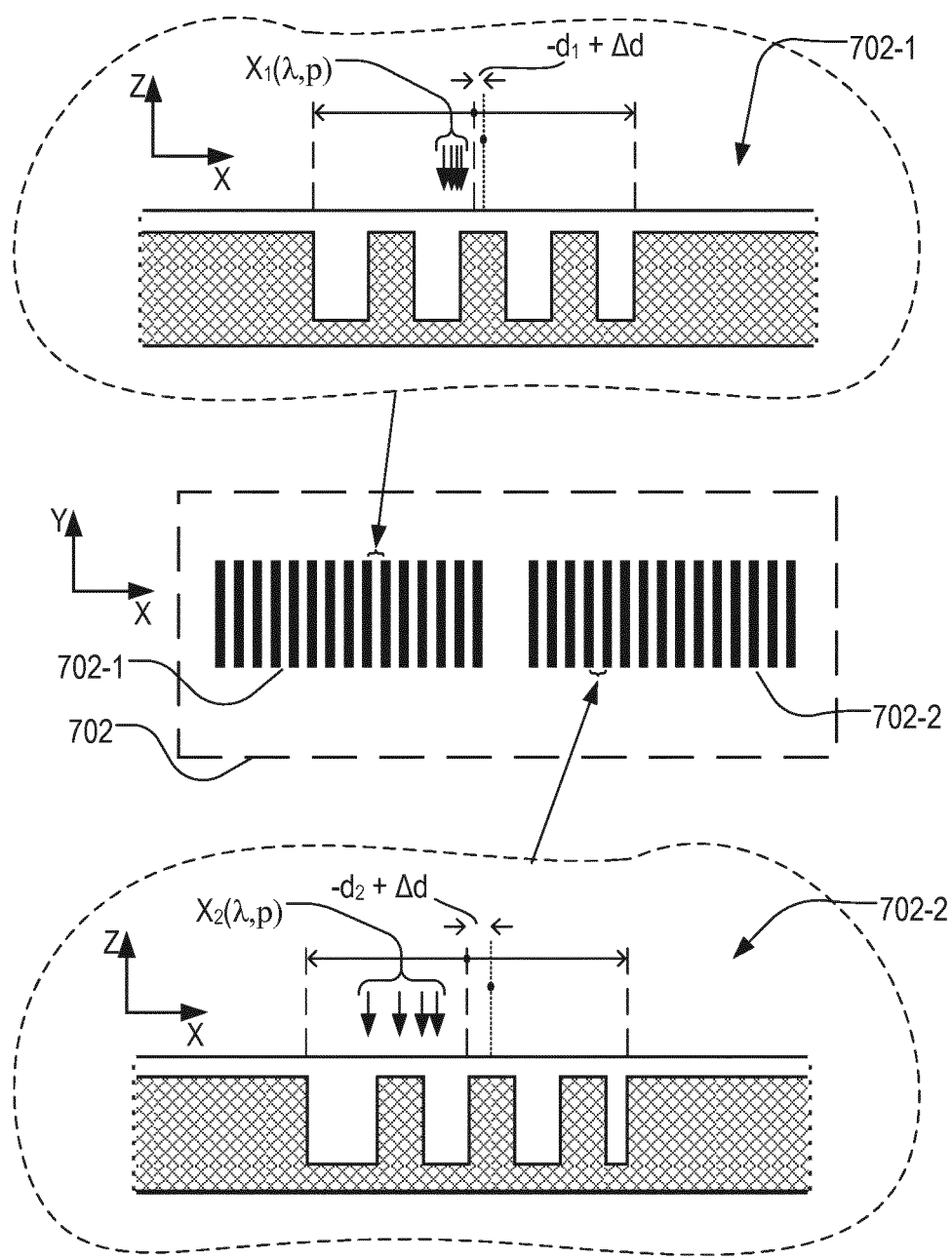
FIG. 10 shows in plan and cross-section a two-part differential alignment mark in accordance with an embodiment of the present invention.

FIG. 10 illustrates the structure of a modified alignment mark 702 for use in exploiting the principle presented above. The novel mark can be used in place of the simple mark 202. Versions with Y direction and XY direction can be readily envisaged also. The mark 702 is effectively a composite mark having two segments 702-1 and 702-2. Each segment is itself a mark comprising a sub-segmented grating of the general form illustrated in FIG. 5. Nearby would also be provided coarser structures by which the mark can be "captured" by the sensor in a preliminary step. Such details are well known to the skilled reader. A schematic cross-section of first segment 702-1 is shown at the top of the drawing, while a cross-section of second segment 702-2 is shown at the bottom. In the cross-sections, as in FIG. 5, only one of the repeating units of the overall pattern is shown, centered on a space region. Only three at-resolution marks are shown, and shifts are exaggerated for clarity. A real mark would have in the region of ten to twenty at-resolution marks and spaces in each space region of the larger pattern. In each segment there is both an unknown mismatch $\Delta d$ caused by aberration or the like during formation of the mark, and a known offset d. The unknown mismatch is equal (or assumed equal) for the two segments, while the mark is designed so that the first segment has an offset $d_1$ which is known and different from the offset $d_2$ applied in segment 702-2. In practice, one would choose the offsets $d_1$, $d_2$ to be positive and negative values of equal magnitudes so as to balance the deliberate offset d either side of zero (that is, $d_1=-d_2$). However, the method to be described works with unequal magnitudes and with offsets that are both in the same direction. Similarly, the offset does not need to be either larger or smaller than the unknown mismatch. The example illustrated in FIG. 10 has offsets in opposite directions, but with magnitudes less than the (unknown) mismatch $\Delta d$. Therefore the total offset is in the same direction both segments.

Figure 11:
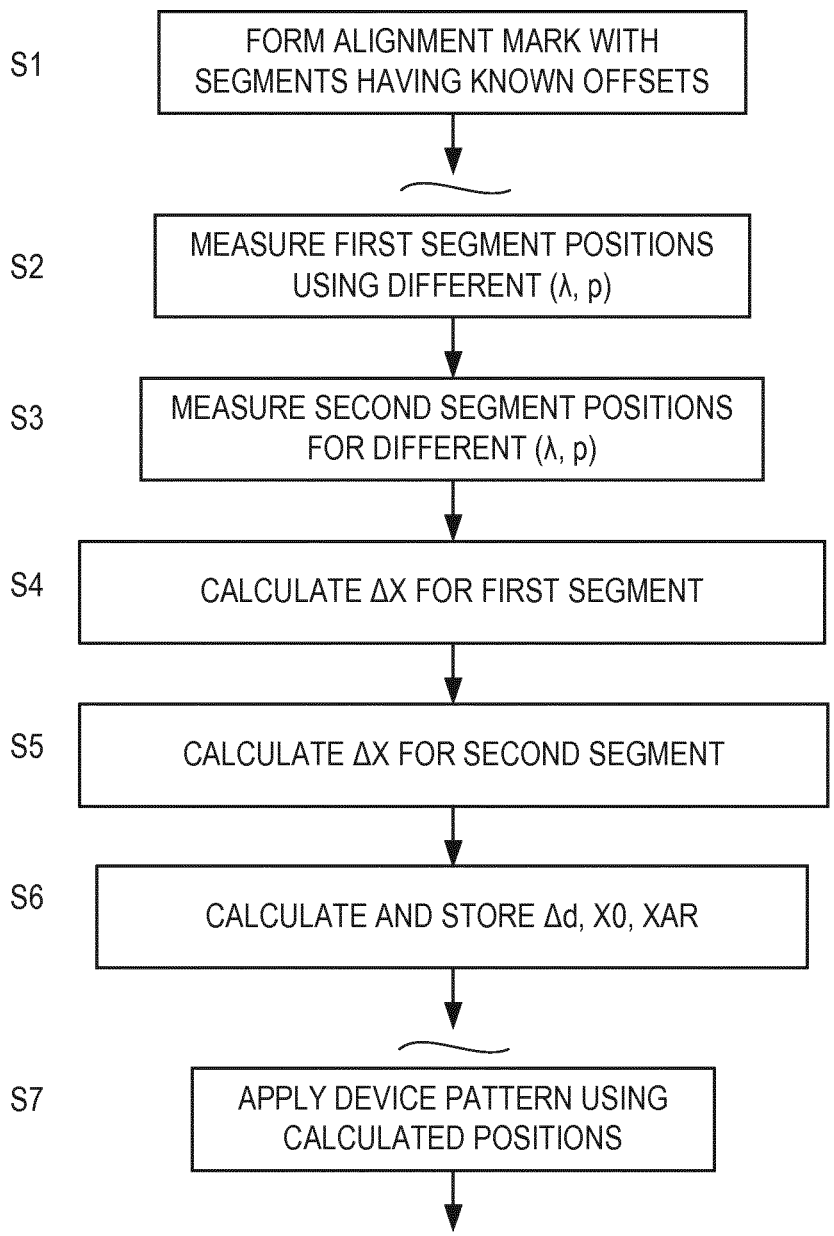
FIG. 11 is a flowchart of a method of measuring position using the differential alignment mark of FIG. 10.

Referring to the flowchart of FIG. 11, we now describe one embodiment of a method to obtain more detailed position measurements using the new mark with segments and offsets d. It is assumed that the measurements are performed as part of an alignment step in a lithographic apparatus of FIG. 1, but the method can of course be applied to make position measurements for other purposes. A simple example will be presented using just two segments of the type shown in FIG. 10 and two wavelength/polarization combinations to measure position in one direction. More complexity can be added in a real implementation, if desired, and some extensions of the method will be described briefly below. The steps of this method can be combined with the performance of other measurements using the same marks. Fewer steps can be applied, if desired, for example, because only one particular result is desired to be output. The overall method will be described first, followed by an explanation of the underlying mathematical calculations. The techniques disclosed herein are in no way limited to these particular examples, or to any particular form or mathematical expression. The concepts explained here can be expressed in many different notations and algorithms, while still applying the basic principles disclosed here.

In step S1, a substrate has one or more marks formed on it to serve as position measurement marks (alignment marks) in the lithographic process. Typically many marks are formed across the substrate. Each mark comprises sub-segmented gratings formed by a lithographic process in which optical aberrations or other causes introduce an unknown mismatch Δd between the positions of the coarse alignment grating and at-resolution features within mark or space regions of the grating. In accordance with the new teaching contained herein, each mark is formed with two or more segments having different known offsets d in addition to the unknown mismatch.

At a later time, perhaps after many intervening process steps, the substrate is loaded into a lithographic apparatus for the purpose (in this example) of applying a device pattern. In step S2, alignment sensor AS of the apparatus is used to obtain two or more measurements $X_1$ of the position of first mark segment 702-1 with different combinations of wavelength and polarization (λ,p). In step S3, two or more measurements $X_2$ of the position of second mark segment 702-2 with the same combinations of wavelength and polarization (λ,p).

In step S4 at least one position difference ΔX is calculated by comparing the different positions measured for the first segment in step S2. In step S5 a position difference ΔX is calculated by comparing the different positions measured for the second segment, using the corresponding pair of positions measured in step S3. Each ΔX corresponds to the same pair of wavelengths and/or polarizations. If multiple measurements are made as in the apparatus of FIG. 4, the best pair to use may be selected according to a predetermined recipe, and/or according to quality evaluation done at the time of measurement. There is nothing to prevent more than two pairs being used to obtain multiple ΔX values for each segment.

In step S6 the values of ΔX for the two segments are combined with values of the known offsets d to calculate any or all of (i) the unknown mismatch Δd, (ii) the true center position $X_0$ of the coarse alignment grating and (iii) the true center position $X_{AR}$ of the at-resolution grating. More detail of these calculations and their underlying rationale will be given below.

Referring again to the example mark illustrated in FIG. 10, the combined shift −d2+Δd in the second segment is shown as being greater in magnitude than the combined shift −d1+Δd in the first mark. The measurements of mark position X that are reported by the sensor for different colors and polarizations in the second segment in step S3 are much more widely spaced, and much further from the true position of either the coarse or at-resolution grating, than the positions reported for the first segment in step S2). In terms of the calculation, the position difference ΔX calculated for the second segment in step S5 will be much greater than ΔX calculated for the first segment in step S4. As we have seen already in the graphs of FIGS. 8 and 9, if one of the offsets would actually cancel the mismatch exactly, all the reported positions would be the same and ΔX for that segment would be zero.

In step S7, after measuring all the desired marks, operating the level sensor and so forth, a product or device pattern is applied at the target portions C of the substrate W (FIG. 1) using the projection system PS of the lithographic apparatus. Because the mismatch has been measured and position values corrected accordingly, positioning of the product features is more accurately aligned with the desired position, and with underlying features made in previous lithographic steps. While the measured coarse grating position $X_0$ is already more accurate than in conventional method, note that the at-resolution $X_{AR}$ position is also directly available, despite these features being far below the resolving power of the alignment sensor. This raises the possibility to use the at-resolution position $X_{AR}$ in the positioning of the applied pattern. Since the at-resolution features are more like the product features in the applied pattern, using this position measurement may give more accurate placement of those product features than the coarse grating position X0 (assuming that the aberrations in the litho step will be similar to the ones in the step that formed the mark). After further lithographic steps, a finished semiconductor device or other product has been formed on the substrate.

The steps of the method can be performed in any desired sequence. The steps S4-S6 of calculation may be performed as discrete steps, or merged into a single larger calculation. Detector signals may be stored for all marks, and processed to obtain position measurements at a later stage. Position measurements may be calculated first for all marks, and corrected later, or corrected measurements may be calculated immediately on scanning each mark.

The mark segments in this example are shown in close proximity, so that they may be considered as being at substantially the same location on a large substrate, and may be measured in a single pass of the sensor. A combined position measurement can then be output to be used in the same manner as a conventional mark. In principle, the two segments could be more widely separated. One attraction of such a step would be to avoid a great overall increase in the area occupied by marks on the substrate. However, the quality of results will depend on whether the mismatch Δd is the same at all locations, or needs to be measured locally to be meaningful. Processing the measurement results and using them in alignment or for other purposes after measurement will be more complicated.

Calculation of Mismatch and Corrected Positions

The mathematical calculation of the various results will now be explained in detail. As mentioned, it is based on the observation that measured position depends linearly on the offset d between coarse and at-resolution features, for any given wavelength/polarization used. Ignoring polarization and concentrating on wavelength for simplicity, we assign a value K(λ) as a coefficient for this linear dependence. For a sub-segmented alignment grating therefore the following relations hold:

$$X(\lambda)=X_0+K(\lambda)\Delta d$$

$$X_0=X(\lambda)-K(\lambda)\Delta d$$

K(λ) is unknown and depends on many properties of the mark and its overlying and underlying stack. Our desire is to find an expression for K(λ) and Δd in order to correct the measured alignment position X(λ) (which is dependent on wavelength and aberration in the process used to form the mark) to a position $X_0$ accurately representing the center of the coarse grating in a manner which is wavelength and aberration insensitive. You can see K(λ) as the sensitivity of the aligned position to a shift in the sub-segmentation. We can obtain K(λ) and Δd with the two segments as explained above by measuring positions from different mark segments having a known offsets in addition to the unknown mismatch. Segment 1 has a sub-segmentation displaced by $d_1$ and segment 2 has a sub-segmentation displaced by $d_2$, so we can write:

$$X_1(\lambda) = X_0 + K(\lambda)[d_1 + \Delta d]$$

$$X_2(\lambda) = X_0 + K(\lambda)[d_2 + \Delta d]$$

$$X_1(\lambda) - X_2(\lambda) = K(\lambda)[d_1 - d_2]$$

$$K(\lambda) = \frac{X_1(\lambda) - X_2(\lambda)}{[d_1 - d_2]}$$

An expression for $\Delta d$ we can find by looking at the two segments for two different wavelengths $\lambda_1$ and $\lambda_2$. For segment 1 this means:

$$X_1(\lambda_1) = X_0 + K(\lambda_1)[d_1 + \Delta d]$$

$$X_1(\lambda_2) = X_0 + K(\lambda_2)[d_1 + \Delta d]$$

And for segment 2:

$$X_2(\lambda_1) = X_0 + K(\lambda_1)[d_2 + \Delta d]$$

$$X_2(\lambda_2) = X_0 + K(\lambda_2)[d_2 + \Delta d]$$

Subtracting for both segments (step S4, S5) we get a position difference $\Delta X$ between these two colors for each segment, giving:

$$X_1(\lambda_1) - X_1(\lambda_2) = K(\lambda_1)[d_1 + \Delta d] - K(\lambda_2)[d_1 + \Delta d] = [K(\lambda_1) - K(\lambda_2)][1 + \Delta d]$$

$$X_2(\lambda_1) - X_2(\lambda_2) = K(\lambda_1)[d_2 + \Delta d] - K(\lambda_2)[d_2 + \Delta d] = [K(\lambda_1) - K(\lambda_2)][d_2 + \Delta d]$$

Dividing both equations gives:

$$\frac{X_1(\lambda_1) - X_1(\lambda_2)}{X_2(\lambda_1) - X_2(\lambda_2)} = \frac{[d_1 + \Delta d]}{[d_2 + \Delta d]} = C$$

Hence in Step S6 we can derive an expression for $\Delta d$ as:

$$\Delta d = \frac{d_1 - Cd_2}{C - 1}$$

Using this we can calculate the true center position $X_0$ of the coarse alignment grating by:

$$X_0 = X_1(\lambda) - K(\lambda)[d_1 + \Delta d] = X_1(\lambda) - \frac{X_1(\lambda) - X_2(\lambda)}{[d_2 - d_1]\left[d_1 + \frac{d_1 - Cd_2}{C - 1}\right]}$$

We can independently calculate the center position $X_{AR}$ of the at-resolution grating by:

$$X_{AR} = X_0 + \Delta d$$

Hence the differential segmented mark alignment strategy is able to recover the position of the at-resolution structure based on a combination of the known different offsets of the mark segments ($d_1$, $d_2$) and measurable parameters (in this case a color to color difference measured at segment 1 and a color to color difference measured at segment 2). As already mentioned, we do not need stack information to perform this calculation, and it can be performed using the new mark, but with only the position signals already provided in a typical alignment sensor. The technique is further independent of the particular type of alignment sensor used, and can be applied with other sensors and not only one based on the self-referencing interferometer shown in FIGS. 3 and 4.

Simulated Measurement Results

To show the success of the method, FIG. 12 compares corrected and uncorrected measurements calculated using the method just described. Parameters of the grating are the same as described for FIG. 6 above. Measurements were made at different polarizations in graphs (a) and (b). A mark was modeled with (unknown) mismatch $\Delta d = 0.5$ nm and segment offsets $-1$ nm and $+1$ nm. Wavelengths of 650 nm and 850 nm were used. Only the segment offsets d1, d2 were known for the purposes of the simulated measurement calculation. The graphs show that the alignment position $X_{AR}$ of the at-resolution features can be measured very accurately and independent of wavelength, by the method presented above.

As mentioned already, the technique illustrated is not limited to comparing position measurements obtained using different wavelengths. Different polarizations may be used, and/or different combinations of polarization and wavelength. Furthermore, position measurements of the same mark can be obtained using different illumination profiles, with similar results. Even within a single combination of wavelength, polarization and illumination profile, the position-dependent signal obtained from a detector 430a or 430b will contain several spectral components. And not only a pure sine wave corresponding to the coarse grating pitch. In the co-pending application [ref P-4099] mentioned above, it is explained in more detail how different spatial frequency components of a single position-dependent optical signal can be extracted from the position-dependent signal detected in the alignment sensor. In simple terms, these different spectral components represent fundamental and harmonic spatial frequencies of the periodic grating and their magnitude and phase can be extracted by Fourier analysis. Each of these spectral components can be processed to obtain a position measurement. These different position measurements will be influenced in different ways by the offset, and can be used to measure mismatch and positions in the manner described above.

The skilled person will recognize that pairs of position measurements can be used whose difference is in only one of the parameters: wavelength, polarization, illumination profile and special frequency spectral component. Equally, pairs of position measurements can be used that differ in more than one of these parameters at the same time. The content of the co-pending application [P-4099] is incorporated herein by reference.

The technique illustrated is not limited to linear interpolation, but can be extended readily to correct higher order (quadratic, cubic etc.) terms if desired. It happens that, with the marks and the lithographic processes considered in these examples, a linear relationship holds very strongly, as seen in the graphs. There is typically no quadratic component at all, due to symmetry of the system. This linearity can be understood intuitively from the fact that the at-resolution features and offsets are very small in comparison with the pitch of the periodic position-dependent signal seen by the alignment sensor AS. However, there is a small cubic term that could be corrected, and in other situations the higher order terms could be significant. To correct these higher order terms, more points on the response curve are needed, namely four to correct a cubic term, so four mark segments with four different, known offsets would be provided. One would have to decide whether the improved information justifies the additional complication and "real estate" occupied by the additional segments. One could also seek to sample more points on the graph of position difference against offset, simply to improve accuracy of the linear interpolation. The fact that the technique works very well with only two samples should not be taken as excluding embodiments in which it is extended for whatever reason.

CONCLUSION

From the above disclosure, we see how measurements of a position can be made that directly or indirectly measure accurate positions of the coarse and at-resolution features in a mark, even when an unknown mismatch exists between those positions. This improved measurement can be obtained using novel different marker patterns, but using position dependent signals existing in the alignment sensor. Some of these signals may for example be position measurements produced using different colors and/or polarizations of position-dependent optical signals detected in the alignment sensor. They may alternatively or in addition be position measurements made using different illumination profiles and/or using different spectral components of the same position-dependent signal.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of measuring positions of marks on a substrate using an optical system, each mark comprising structures arranged periodically in at least a first direction, at least some of said structures comprising smaller sub-structures, each mark being formed with a positional offset between the structures and the sub-structures that is a combination of both known and unknown components, the method comprising:
    (a) illuminating each mark with radiation and detecting radiation diffracted by said structure using one or more detectors to obtain signals containing information on the position of the mark;
    (b) processing said signals to calculate a measured position of at least one mark, the calculation using signals from a plurality of marks, together with information on differences between the known offsets of said marks, in order to correct for said unknown component of said positional offset.

2. A method as claimed in claim 1 wherein in step (a) a plurality of signals containing position information are obtained for each mark, each signal having the same form but being obtained using radiation having different characteristics.

3. A method as claimed in claim 2 wherein the calculation in step (b) is based at least partly on a combination of (i) differences between certain signals from among the plurality of signals obtained for the same mark and (ii) ratios between said differences for marks having different known offsets.

4. A method as claimed in claim 2 wherein the calculation in step (b) is based at least partly on the assumption that a relationship between the position information contained in a signal and the positional offset of a mark has the same mathematical form for each of said plurality of signals.

5. A method as claimed in claim 4 wherein said relationship is assumed to be a linear relationship.

6. A method as claimed in claim 2 wherein said radiation having different characteristics includes radiation having different wavelengths.

7. A method as claimed in claim 1 wherein in step (a) a plurality of signals containing position information are obtained for each mark, each signal comprising different spectral components of a position-dependent signal obtained by a single detector.

8. A method of manufacturing devices wherein a device pattern is applied to a substrate using a lithographic process, the method including positioning the applied pattern by reference to measured positions of one or more marks formed on the substrate, the measured positions being obtained by a method as claimed in claim 1.

9. A method as claimed in claim 8 wherein the applied pattern is positioned by reference to a position measurement that is referenced to the positions of said sub-structures including said unknown offset, rather than to the positions of said structures without said unknown offset.

10. A lithographic apparatus comprising:
a patterning subsystem configured to transfer a pattern to a substrate;
a measuring subsystem configured to measure positions of said substrate in relation to the patterning subsystem,
wherein the patterning subsystem is arranged to use the positions measured by the measuring subsystem to apply said pattern at a desired position on the substrate and wherein the measuring subsystem is arranged to position the applied pattern by reference to measured positions of marks provided on the substrate and wherein the measuring subsystem is arranged to calculate said measured positions of said marks by a method as claimed in claim 1.

11. A non-transitory computer program product comprising machine-readable instructions configured to cause a processing device to perform the calculation of step (b) of the method claimed in claim 1 to obtain a measured position of one or more marks.

12. A product as claimed in claim 11 further comprising instructions configured to control a lithographic apparatus to apply a pattern to said substrate at a position defined by reference to the calculated position of the mark.

13. An apparatus to measure positions of marks on a substrate, the apparatus comprising:
an optical system configured to illuminate each mark with radiation and configured to detect radiation diffracted by said structure using one or more detectors to obtain signals containing information on the position of the mark;
a processing arrangement configured to process signals representing the diffracted radiation to obtain a plurality of results related to a position of the structure, each result being influenced in a different way by variations in a property of the structure; and
a calculating arrangement configured to calculate a position of said structure using one or more of the results obtained by said processing arrangement,
wherein said calculating arrangement is arranged to calculate a measured position of at least one mark using signals from a plurality of marks, each mark comprising structures arranged periodically in at least a first direction, at least some of said structures comprising smaller sub-structures, each mark being formed with a positional offset between the structures and the sub-structures that is a combination of both known and unknown components, the calculating arrangement using said signals together with information on differences between known offsets of said marks in order to correct for said unknown component of said positional offset.

14. An apparatus as claimed in claim 13 wherein said illuminating arrangement is arranged to illuminate the structure with radiation of a plurality of combinations of wavelength and polarization, said detecting arrangement is arranged to detect separately the radiation of said plurality of combinations and wherein said plurality of results obtained by the processing arrangement include a plurality of results obtained using radiation of different combinations.

15. An apparatus as claimed in claim 13 wherein said plurality of results obtained by the processing arrangement include a plurality of results corresponding to different diffraction orders in the diffracted radiation.

16. An apparatus as claimed in claim 13 wherein said apparatus is arranged to scan said structure with said radiation and said optical system includes an interferometer arranged to generate at least one position dependent signal that varies as the apparatus scans the structure.

* * * * *